United States Patent [19]
Keum

[11] Patent Number: 5,300,377
[45] Date of Patent: Apr. 5, 1994

[54] METHOD OF MANUFACTURING A PHASE SHIFT MASK COMPRISING TWO PHASE SHIFT LAYERS AND SLOPING SIDEWALLS

[75] Inventor: Eun S. Keum, Kyungki-do, Rep. of Korea

[73] Assignee: Gold Star Electron Co., Ltd., Chungcheongbuk-Do, Rep. of Korea

[21] Appl. No.: 879,481

[22] Filed: May 7, 1992

[30] Foreign Application Priority Data

May 9, 1991 [KR] Rep. of Korea ................ 7494/1991

[51] Int. Cl.$^5$ ............................................. G03F 9/00
[52] U.S. Cl. ...................................... 430/5; 430/322; 430/324
[58] Field of Search .................... 430/5, 22, 269, 322, 430/324, 396

[56] References Cited

U.S. PATENT DOCUMENTS

5,045,417  9/1991  Okamoto .................................. 430/5
5,079,113  1/1992  Ohta et al. ............................... 430/5

*Primary Examiner*—Marion E. McCamish
*Assistant Examiner*—S. Rosasco
*Attorney, Agent, or Firm*—Faegre & Benson

[57] ABSTRACT

In order to manufacture a phase shift mask for hyperfine patterning, a sidewall phase shift mask is formed on both sides of each phase shift film in a spatial frequency modulation type phase shift mask. Accordingly, the light intensity occurring from the end part of the phase shift film, as the forming factor of the bridge pattern film, is reduced by the sidewall phase shift film.

5 Claims, 13 Drawing Sheets

FIG. 3a
PRIOR ART
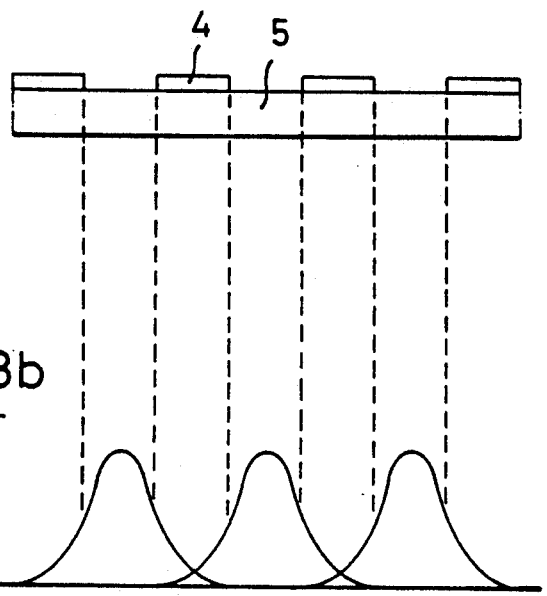
FIG. 3b
PRIOR ART
FIG. 3c
PRIOR ART
FIG. 3d
PRIOR ART
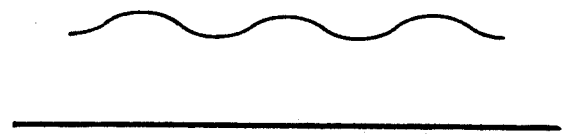

F I G. 9a
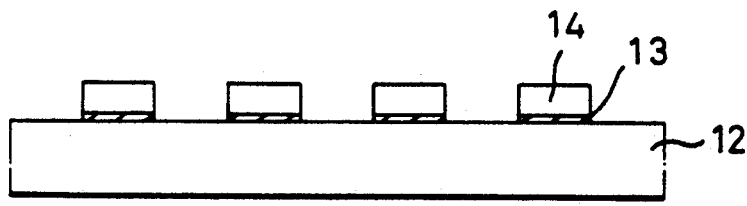
F I G. 9b
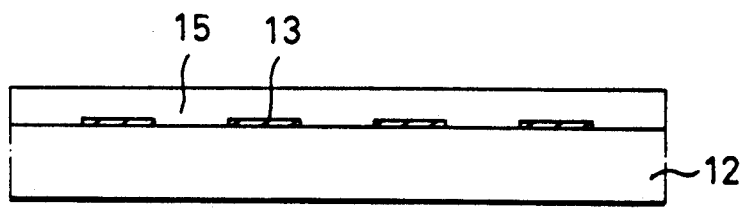
F I G. 9c
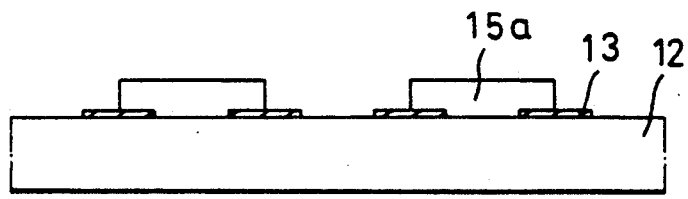

METHOD OF MANUFACTURING A PHASE SHIFT MASK COMPRISING TWO PHASE SHIFT LAYERS AND SLOPING SIDEWALLS

BACKGROUND OF THE INVENTION

The present invention relates to a method of manufacturing a phase shift mask, and more particularly to a method of manufacturing a spatial frequency modulation type phase shift mask. A mask for hyperfine patterning of a submicron unit has recently been required in accordance with high integration of all elements.

In order to meet this requirement, the phase shift mask has been developed, and the manufacturing theory on the phase shift mask is as follows.

As shown in FIG. 1, a phase shift film 1 is basically necessary for manufacturing the phase shift mask and the role of the phase shift film 1 is to shift the phase of light amplitude to be incident. Here, the number 2 indicates chrome Cr and the number 3 indicates silica Si.

FIG. 2 shows the light amplitude and a graph (a) indicates the light amplitude to be incident to silica 3 when the phase shift film 1 is not there, and a graph (b) indicates the light amplitude when the above film 1 is there.

In accordance with FIG. 2, the phase of the light amplitude is known to have been shifted 180° by the phase shift film. Here, if n is the refractive index of the phase shift film, d the thickness, and $n_0$ the air refractive index, the phase difference $\delta$ of graph (a) and (b) (of FIG. 2) can be put into the following formula (1).

$$\begin{aligned} \delta &= k \cdot n \cdot d - k \cdot n_0 \cdot d \\ &= k \cdot (n - n_0)d \\ &= \frac{2\pi}{\lambda} (n - 1)d \end{aligned} \quad (1)$$

At this time, the phase difference $\delta$ should be 180°, in order that the phase is perfectly shifted. If $\pi$ is substituted into the formula (1) instead of the phase difference $\delta$, the thickness of the phase shift film, to be perfectly shifted, can be put into the following formula (2)

$$d = \frac{\lambda}{2(n-1)} \quad (2)$$

With reference to FIG. 3(a)-(d) and FIG. 4(a)-4(d), comparing the general mask with the phase shift mask, the state is as follows.

FIG. 3 (a) shows the state that the general masks 4 for pattern are aligned in parallel on the substrate, FIG. 3 (b) shows the light amplitude out of the mask 4, FIG. 3 (c) shows the light amplitude out of the substrate 5, and FIG. 3 (d) shows the light intensity.

As shown in FIG. 3 (b), the light amplitudes out of the mask 4 offset each other, and the classification of intensity is not clear on the substrate, because the difference of the light amplitude is slight, as shown in FIG. 3 (c) and FIG. 4 (d). Accordingly, when hyperfine patterning is executed, the degree of offset is larger, so that hyperfine patterning cannot be performed with the above mask 4.

FIG. 4 (a) shows the alignment state of the phase shift mask 7 having the phase shift film 6 between masks 4. FIG. 4 (b) shows the light amplitude from the mask 4, FIG. 4 (c) shows the light amplitude from the substrate 5, and FIG. 4 (d) shows the light intensity. As shown in FIG. 4 (c) and FIG. 4 (d), the difference of the light amplitude is bigger, so that the classification of intensity is clear, therefore hyperfine patterning is in a better position.

The different types of phase shift masks include a spatial frequency modulation type, an edge stress type and a cut-off effect stress type, and these will be explained with reference to FIG. 5 (a)~FIG. 5 (f).

FIG. 5 (a) shows a spatial frequency modulation type. The patterning is performed after the chrome film 9 is formed on the silica substrate 8, and then the phase shift film 10 is formed between the patterned chrome film 9.

FIG. 5 (b) and FIG. 5(c) show the edge stress type. The phase shift film 10 is formed so as to shield the patterned chrome film 9, or the phase shift film 10 is formed on the chrome film 9.

FIG. 5 (d)~FIG. 5 (f) show the cut-off effect stress type. The phase shift film 10 is formed between the patterned chrome film 9 and the chrome film 9, or the phase shift film is formed on the separated chrome film 19 after having been patterned and separated from the patterned chrome film 9 again, or the chrome film 9 is formed on the silica substrate 8 not to be etched after having been patterned in advance and repeatedly etched enough to the predetermined width.

With reference to FIG. 6 (a)~FIG. 6 (d), the manufacturing process of a spatial frequency modulation type phase shift mask as a prior art of the present invention among the above 3 techniques will be explained.

FIG. 6 (a) is a plan view of the manufactured phase shift mask, and FIG. 6 (b)~FIG. 6 (d) are cross-sectional views of manufacturing processes along the line a-a' of FIG. 6 (a), and FIG. 6 (e) is a cross-sectional view along the line b-b' of FIG. 6 (a).

First, the chrome film 9 is formed on the silica substrate 8, as in FIG. 6 (b), and then the process of photo-/etch is performed on the chrome film 9 by using the negative photoresist 11 and the chrome film 9 is patterned. And, the phase shift film 10 is generally formed on the patterned chrome film 9, as in FIG. 6 (c), and then the phase shift film 10 is patterned by the dry-etch method, so that the above film 10 is left between the chrome film 9 and the adjacent chrome film 9, as in FIG. 6 (d). As a consequence, the manufacture of the phase shift mask is completed.

When the wafer spread with photoresist is developed by using the phase shift mask, as in FIG. 6 (a), the ideal pattern film 11, as in FIG. 7 (a), is not formed, but the pattern film, as in FIG. 7 (b), is formed. Namely, the normal pattern film 11 is formed in the direction of the line a-a' of FIG. 6 (a), but the unnecessary bridge pattern film 11a is formed in the edge part of the direction of the line b-b' having only the phase shift film 10 without the chrome film 9.

With reference to FIGS. 8 (a) and (b), the reason that the bridge pattern film 11a is to be formed, will be explained as follows.

As light is incident, the light amplitude has a predetermined positive level value in the part without the phase shift film 10, but the light amplitude has a negative level value, having the same absolute value as the above positive level value, on both sides of the edge part in the phase shift film 10. Accordingly, the light intensity to have been incident has a negative impulse value on both sides of the edge part in phase shift film 10, as in FIG. 8 (b). Therefore, as shown in FIG. 7 (b), the unnecessary bridge pattern film 11a is formed between the pattern films 11.

Further, control of the manufacturing process is difficult, owing to using the negative photoresist, when the predetermined wafer is patterned by using the above conventional spatial frequency modulation type phase shift mask.

SUMMARY OF THE INVENTION

The object of the present invention, which has been accomplished in view of the above situation, is to provide a manufacturing process of a spatial frequency modulation type phase shift mask, to prevent the bridge pattern film from occurring in the edge part of the phase shift film without the chrome film.

In order to achieve the above object, the chrome film is formed on the surface of the silica substrate and patterned, and then the first phase shift film is formed between the patterned chrome films. Continually, the other second phase shift film is formed, and then the second phase shift film is etched by the dry etching method, and the sidewall phase shift film is formed on both sides of the first phase shift film. Accordingly, the occurrence of the unnecessary bridge pattern film can be prevented in the place with the phase shift film.

Figure 1:
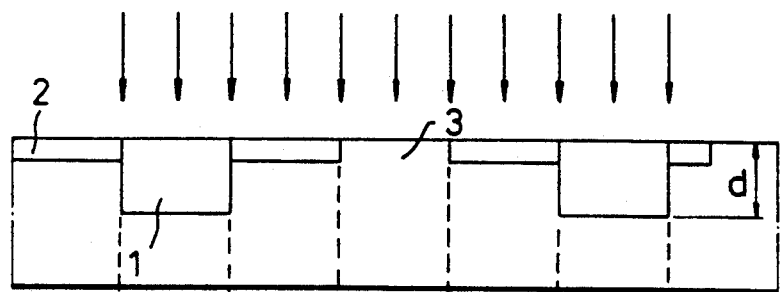
FIG. 1 and FIG. 2 are explanatory diagrams showing principles of the phase shift mask, FIG. 3 (a) is a cross-sectional view of a general mask, FIG. 3 (b) is a light amplitude view from the other mask according to the structure of FIG. 3 (a), FIG. 3 (c) is a light amplitude view from a wafer according to the structure of FIG. 3 (a), FIG. 3 (d) is a diagram of light intensity according to the structure of FIG. 3 (a), FIG. 4 (a) is a cross-sectional view of a general phase shift mask, FIG. 4 (b) is a light amplitude view from a mask according to the structure of FIG. 4 (a), FIG. 4 (c) is a light amplitude view from a wafer according to the structure of FIG. 4 (a), FIG. 4 (d) is a diagram of light intensity according to the structure of FIG. 4 (a), FIG. 5 (a)~FIG. 5 (f) are cross-sectional views according to the type of conventional phase shift mask, FIG. 6 (a) is a lay out of a conventional spatial frequency modulation type phase shift mask, FIG. 6 (b)~FIG. 6 (d) are cross-sectional views of manufacturing processes according to the line a-a' of FIG. 6 (a), FIG. 6 (e) is a cross sectional view according to the line b-b' of FIG. 6 (a), FIG. 7 (a) is a plan view of an ideal pattern film formed by the phase shift mask of FIG. 6 (a), FIG. 7 (b) is a plan view of a substantial pattern film formed by the phase shift mask of FIG. 6 (a), FIGS. 8 (a) and (b) are explanatory diagrams showing the cause of the occurrence of a bridge pattern film depending on a conventional technique, FIG. 9 (a)~FIG. 9 (i) are cross-sectional views of the manufacturing processes of the phase shift mask according to the present invention, FIG. 10 (a)-FIG. 10 (e) are explanatory diagrams, showing the reason that a bridge pattern film is removed by the present invention.
Figure 2:
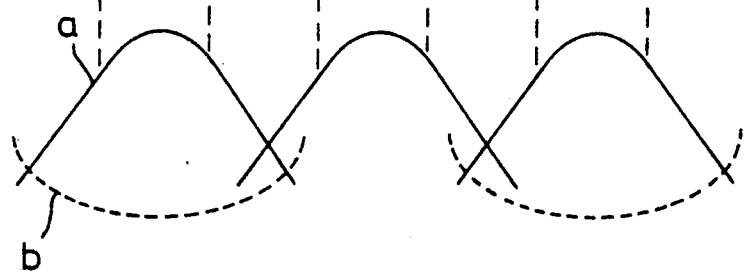
Figure 4A:
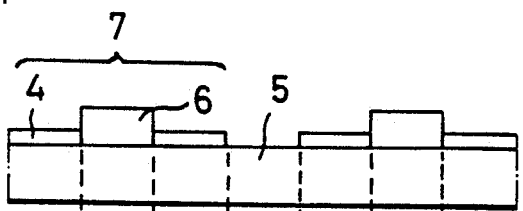
Figure 4B:
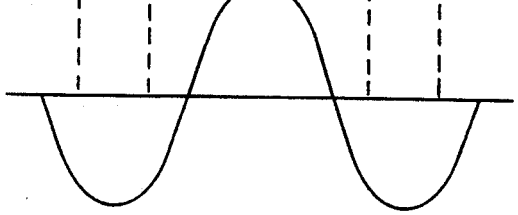
Figure 4C:
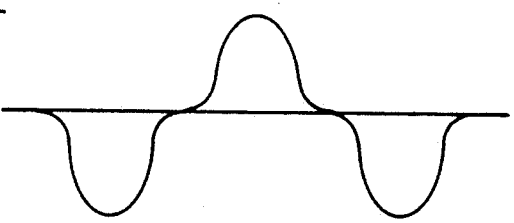
Figure 4D:
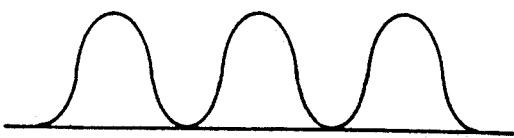
Figure 5A:
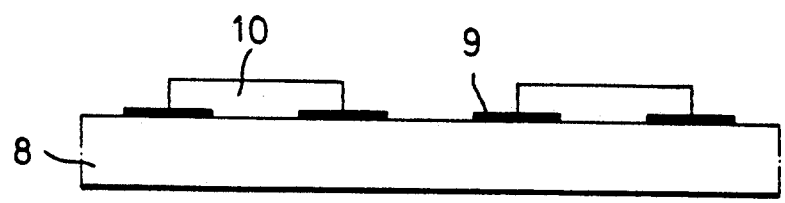
Figure 5B:
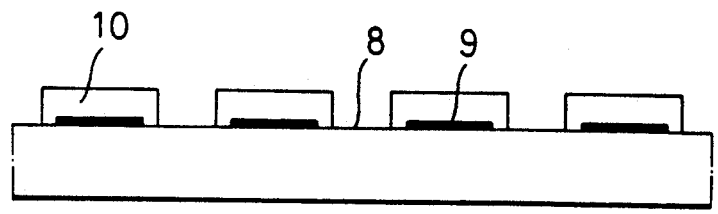
Figure 5C:
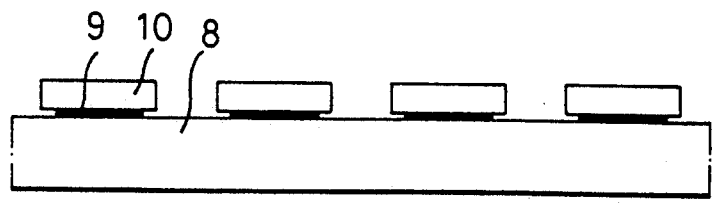
Figure 5D:
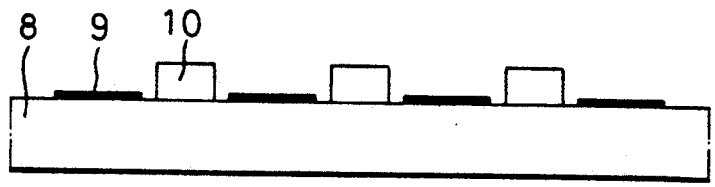
Figure 5E:
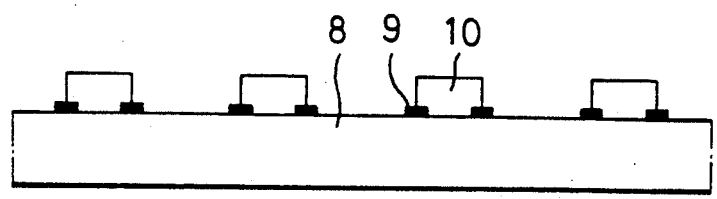
Figure 5F:
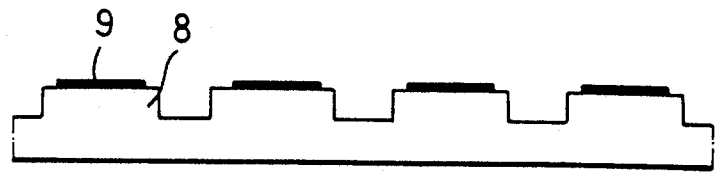
Figure 6A:
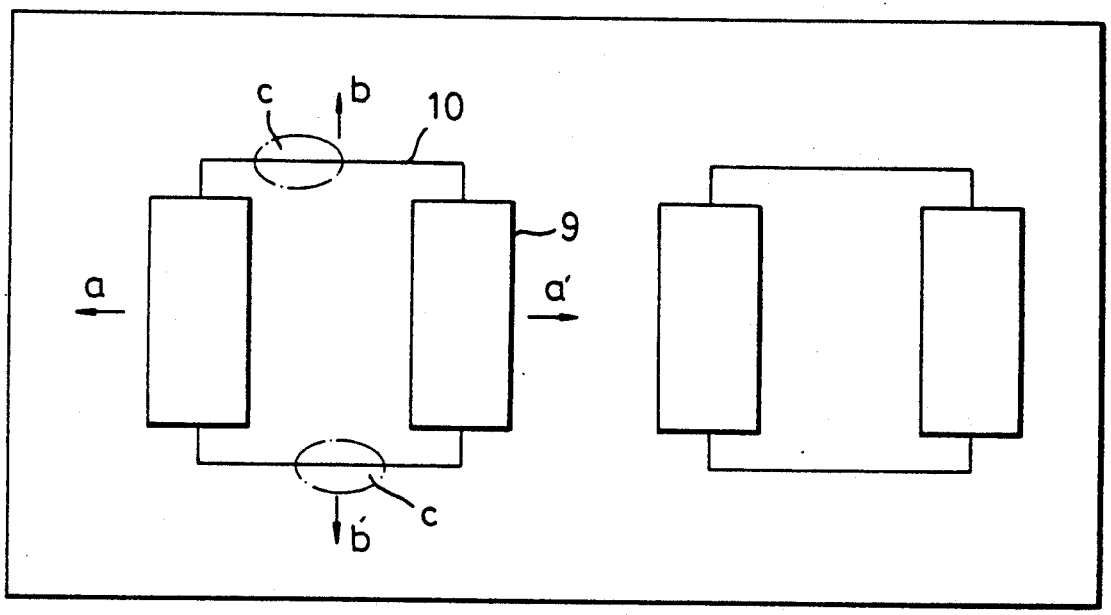
Figure 6B:
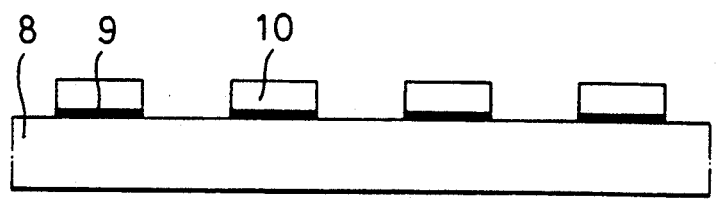
Figure 6C:
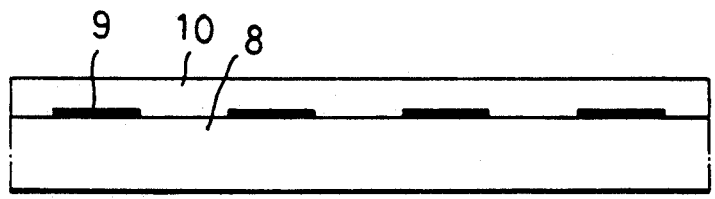
Figure 6D:
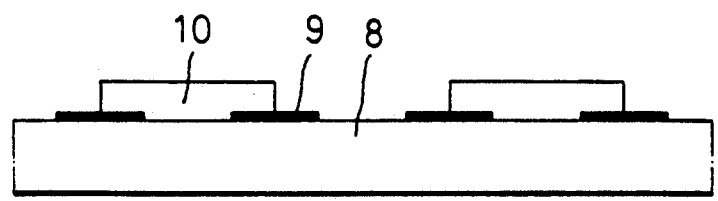
Figure 6E:
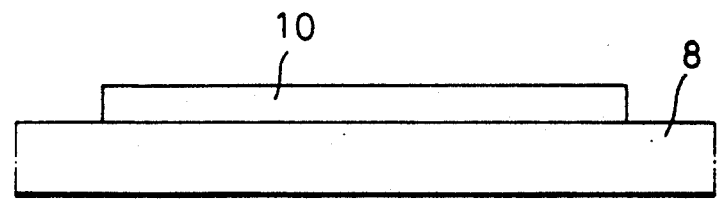

Explanation of the code for the principal parts of the Figures according to the present invention:

12: silica substrate
13: chrome film
14: photo-resist
15,15a,16,16a: phase shift mask

DETAILED DESCRIPTION OF THE PREFERRED EMBODIMENT

With reference to FIG. 9 (a)~FIG. 9 (i), the manufacturing process of the spatial frequency modulation type phase shift mask according to the present invention will be explained as follows.

Here, the layout shown in FIG. 6 (a) is the same thing as the conventional layout, so the above explanation is omitted.

FIG. 9 (a)~FIG. 9 (e) show the cross-sectional view of the manufacturing processes along the line a-a' of FIG. 6 (a), and FIG. 9 (f)~FIG. 9 (i) show cross-sectional views of the manufacturing processes along the line b-b' of FIG. 6 (a).

First, the chrome film 13 is formed on the whole surface of the silica substrate 12, as in FIG. 9 (a), and the photoresist 14 is coated on the chrome film 13. Then, the photo process is performed, and the unnecessary photoresist 14 is removed, and then the unnecessary part of the chrome film 13 is removed by the mask of the remaining positive photoresist 14. Continuously, the first phase shift film 15 is generally formed on the patterned chrome film 13 and the exposed silica substrate, as in FIG. 9 (b), and then the above is removed by the ordinary photo-etch except between the upper sides of the chrome films 13.

At this time, the width of the patterned first phase shift film should not be removed from the upper sides of the chrome film 13. Then, the second phase shift film 16 is generally formed, as in FIG. 9 (d), and etched by the ordinary RIE (Reactive Ion Etching) method, and the sidewall phase shift film 16a is formed on both sides of the above patterned first phase shift film 15a, as in FIG. 9 (e). The above process will be explained by the line b-b' of FIG. 6 (a) as follows.

First, the phase shift film 15 is formed on the silica substrate, as in FIG. 9 (f), and then patterned, as in FIG. 9 (g). Continuously, the second phase shift film 16 is formed, in order to form the sidewall, as in FIG. 9 (g), and the second phase shift film 16 is dry-etched by the RIE method, and then the sidewall phase shift film 16a is formed on both sidewalls of the patterned first phase shift film 15a, as in FIG. 9 (i).

Since the sidewall phase shift film 16a is formed on the side of the first phase shift film 15a patterned thus, the bridge pattern from both edge parts of the patterned first phase shift film 15a can be prevented from occurring.

With reference to FIG. 10 (a)~FIG. 10 (d), the principle (i.e., theory) that the bridge pattern does not occur, will be explained as follows.

FIG. 1 (a) shows a cross-sectional view of the phase shift mask along the line b-b' of FIG. 6 (a) as a layout, and the codes (p₁) (p₂) (p₃) (p₄) show each position of the sidewall phase shift film 16a.

Figures 7A, 7B:
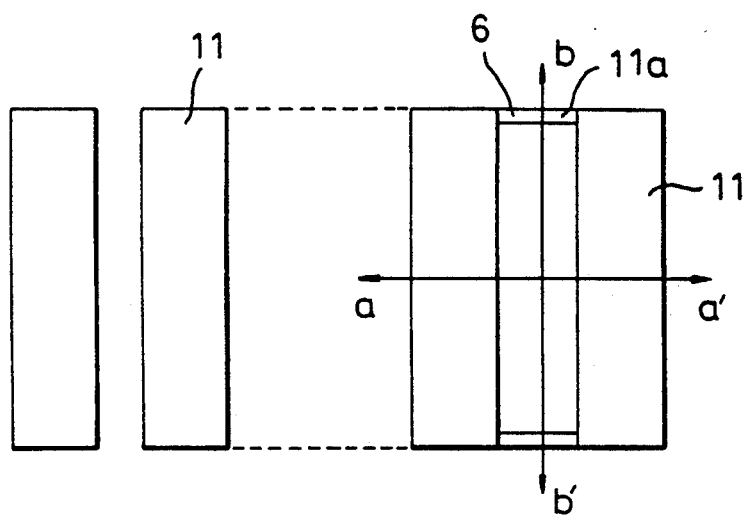
Figure 8A:
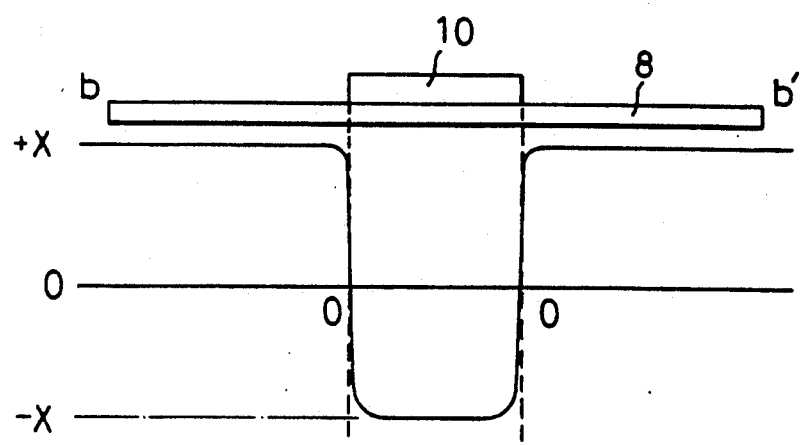
Figure 8A:
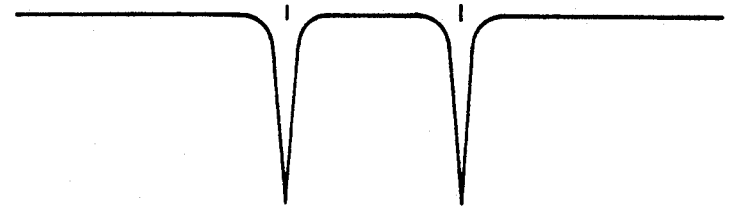
Figure 9D:
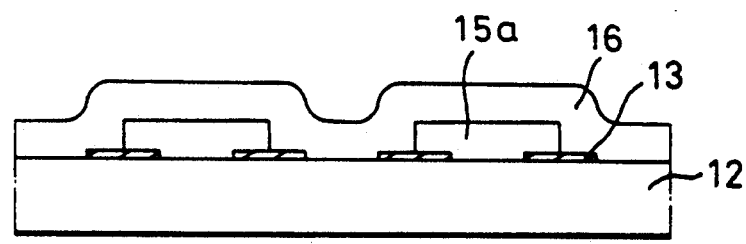
Figure 9E:
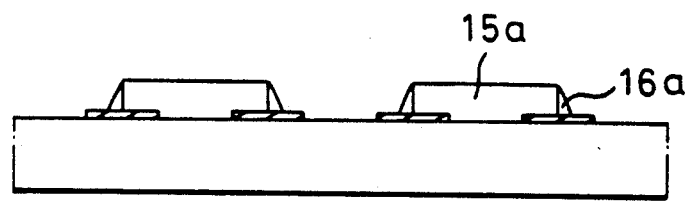
Figure 9F:
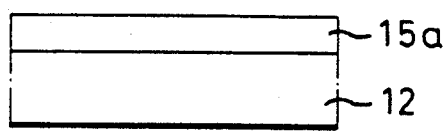
Figure 9G:
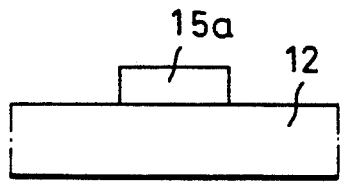
Figure 9H:
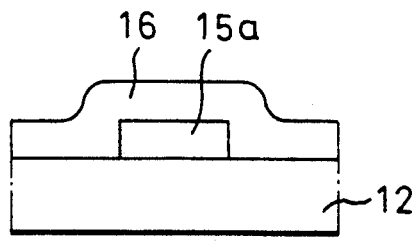
Figure 9I:
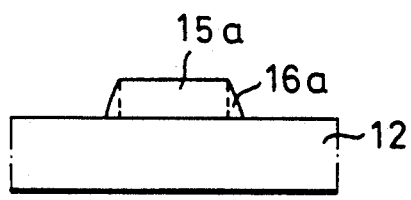
Figure 10A:
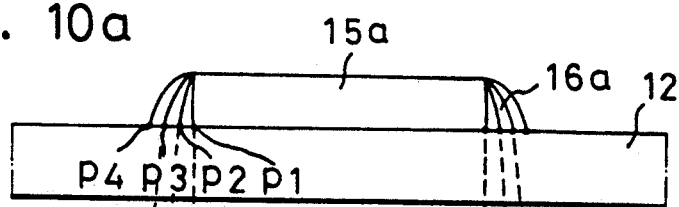
Figure 10B:
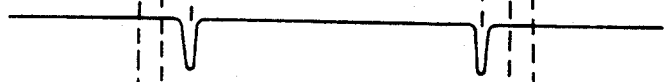
Figure 10C:
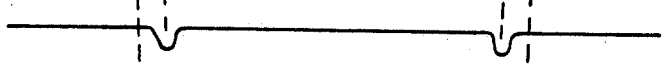
Figure 10D:
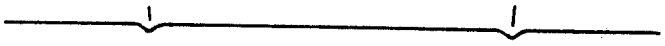
Figure 10E:

When the position p₁ of FIG. 10 (a), or the side of the phase shift film 16a is perpendicular, the light intensity shows the negative impulse value, as in FIG. 10 (b), with the same case, as in FIG. 8 (b). In this case, the unnecessary bridge pattern film 11a is formed, as in FIG. 7 (b).

The light intensity is gradually reduced at the positions p₂, p₃ of FIG. 10 (a), as in FIG. 10 (c) and FIG. 10

($d$), and the light intensity is completely vanished at the position $p_4$ of the edge part in the sidewall phase shift film 16a, as in FIG. 10 ($e$). Thus, as the pattern film is formed by using the phase shift mask manufactured in accordance with the present invention, the bridge pattern film 11a, occurring at the edge parts of both sides in the first phase shift film 15a, can be prevented. Since the light intensity is nearly reduced in the zero state at the sidewall phase shift film, according to the phase shift mask of the present invention, the occurrence of the bridge pattern film at the edge parts of both sides in the first phase shift film can be prevented. Further, as the predetermined wafer is patterned by using the phase shift mask, the profile of the wafer patterned thus is favorable because positive photoresist can be used.

What is claimed is:

1. A method of manufacturing a phase shift mask comprising:
    (a) forming a light shielded film on a light incident substrate;
    (b) forming in parallel a plurality of pairs of light shielded pattern films, having a predetermined interval from each other, after having patterned the above light shielded film;
    (c) forming a first phase shift film on a whole surface formed by steps (a) and (b);
    (d) forming a phase shift film between each pair of light shielded pattern films, and then removing the first phase shift film between each pair;
    (e) forming a second phase shift film on a whole surface formed by step (d);
    (f) dry-etching the second phase shift film and forming a non-vertically sloping sidewall phase shift film on a sidewall of each phase shift film.

2. A method of manufacturing a phase shift mask as defined in claim 1, wherein a width of the phase shift film formed between 2 light shielded pattern films, to be constituted with each pair in step (d), is wider than a width of an inside end part and narrower than a width of an outside end part.

3. A method of manufacturing a phase shift mask as defined in claim 1, wherein the dry-etching in step (f) is RIE.

4. A method of manufacturing a phase shift mask as defined in claim 1, wherein the light incident substrate is silica.

5. A method of manufacturing a phase shift mask as defined in claim 1, wherein the light shielded film is chrome.

* * * * *